Sept. 26, 1961 W. B. WARREN 3,002,135

SEMICONDUCTOR DEVICE

Filed June 11, 1958

William B. Warren,
*INVENTOR.*
*BY.*
Billy A. Robbins
*ATTORNEY.*

United States Patent Office 3,002,135
Patented Sept. 26, 1961

3,002,135
SEMICONDUCTOR DEVICE

William B. Warren, Los Angeles, Calif., assignor to Hughes Aircraft Company, Culver City, Calif., a corporation of Delaware Filed June 11, 1958, Ser. No. 741,355
9 Claims. (Cl. 317—240)

This invention relates generally to semiconductor devices and more particularly to an improved contact element for a semiconductor body to be utilized for providing electrical contact to a semiconductor device.

In the prior art it has been customary to provide electrical contact to a semiconductor body by means of a contact element which is held in place upon the surface of a semiconductor body by spring pressure that is inherent within the contact element, by welding, such as the welding of a point contact whisker to the semiconductor body, by soldering or by placing a thermosetting resin about the point of contact upon the semiconductor body. Each of these means of obtaining electrical contact to a semiconductor body has been found to work well in certain applications but it has also been found that each has certain disadvantages.

When the pressure which is imparted by a spring-type contact element is utilized to provide electrical contact to the face of the semiconductor body, one disadvantage which results is that of noise. The contact element is subject to slight movement upon the surface of the semiconductor body which it contacts. This slight movement may be caused by acceleration or vibration of a unit within which a semiconductor device may be included. This slight movement of the contact element upon the surface of the semiconductor body causes noise to be generated. The noise so generated is similar to microphonics as understood in the vacuum tube art. An additional disadvantage of such a contact element, particularly when it is used to provide contact to an alloy material upon the surface of a semiconductor body, is that an oxide layer may tend to build up between the contact element and surface of the semiconductor body which it contacts. As the oxide layer builds up it causes the area of contact between the contact element and the surface of the semiconductor body to decrease. Since there is less contact area as a result of such build up, the device has less current carrying capacity and, therefore, will tend to fall outside specifications for which it may have been originally designed.

When a thermosetting resin or solder is used in order to obtain positive contact between the contact element and the surface of the semiconductor body, two main disadvantages result. In either instance there is a strong likelihood of the inclusion of materials such as fluxes for the solder or solvents for the resin which will act as contaminants to the surface of the semiconductor body. When such is done these contaminants are sealed within the finally packaged semiconductor device and are, therefore, always present and will tend to deteriorate the device and cause it to become unuseable for the desired applications. Additionally, most solders which are presently utilized and most thermosetting resins have a relatively low survival temperature. This being the case, the possible applications of a semiconductor device employing either of these means for obtaining good electrical contact are limited to those areas wherein a relatively low operating temperature is anticipated.

When a contact is provided by welding the whisker or contact element to the semiconductor body surface, the prime disadvantage is that a relatively high temperature is required in order to obtain a melting of the contact element and of the surface of the semiconductor body. Such a high temperature tends in many instances to deteriorate the surface of the semiconductor body. Such a welding process is also inherently limited to the manufacture of semiconductor devices of the point contact type, wherein the welding is accomplished by passing a relatively large overload current through the whisker and into the semiconductor body.

Accordingly, it is an object of the present invention to provide a contact element for a semiconductor body which remains stable at high temperatures and, therefore, provides high operating and survival temperatures for semiconductor devices.

It is another object of the present invention to provide a contact element for a semiconductor body which eliminates the possibility of contaminants being trapped within the packaged device.

It is still another object of the present invention to provide a contact element for a semiconductor body which provides positive contact under extreme acceleration and vibration thereby eliminating microphonic type noise from semiconductor device operation.

It is a further object of the present invention to provide a contact element for a semiconductor device which insures maintenance of the same contact area as originally provided for the device.

It is a still further object of the present invention to provide a contact element for a semiconductor body which assures a positive contact to the surface of a semiconductor body but at the same time eliminates the possibility of damaging the surface of the semiconductor body during application of the contact thereto.

An improved electrical contact element in accordance with the present invention includes an electrical contact element in contact with at least a portion of one surface of a semiconductor body. An alloy is provided which contacts the semiconductor body and the electrical contact element and which includes cadmium as a constituent thereof whereby the contact element is bonded to the surface of the semiconductor body.

Other and more specific objects of the present invention will become apparent from a consideration of the following description taken in conjunction with the accompanying drawing which is presented by way of illustration only and is not intended as limiting the scope of this invention, and in which.

Figure 1:
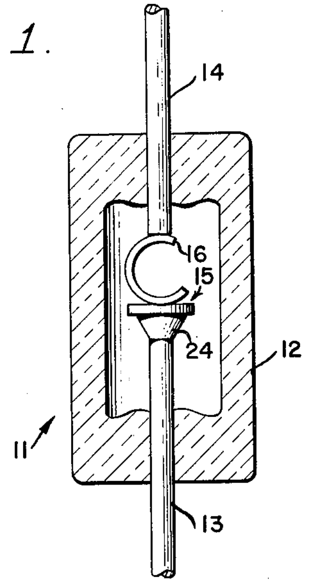
FIG. 1 is a schematic diagram partly in cross section illustrating an encapsulated device constructed in accordance with the present invention.

Referring now to the drawing and more particularly to FIG. 1 thereof, there is shown a semiconductor diode 11. Diode 11 includes a housing 12 which encapsulates a semiconductor body and its electrical contacts. Housing 12 may be constructed from an insulative material, such as glass, as illustrated in FIG. 1. It is to be understood, however, that a housing may be constructed of any material, either insulative of conductive, which is desired. If a glass package, such as shown at 12 in FIG. 1, is utilized it may be constructed as described in Patent No. 2,736,847, issued to S. H. Barnes on February 28, 1956. Electrical conductors 13 and 14 protrude through and into housing 12. A metal to glass seal between each of the leads and the housing provides a hermetic encapsulation for the semiconductor diode. A semiconductor body 15 is attached to lead 13 by any means well known to the art. An electrode 16 is affixed to lead 14 and makes contact with the upper surface of semiconductor body 15.

Electrode 16 may be a spring as shown which takes the form of a C, or in the alternative it may be S-shaped, straight or a typical point contact or a whisker electrode such as is presently well known in the art.

Figure 2:
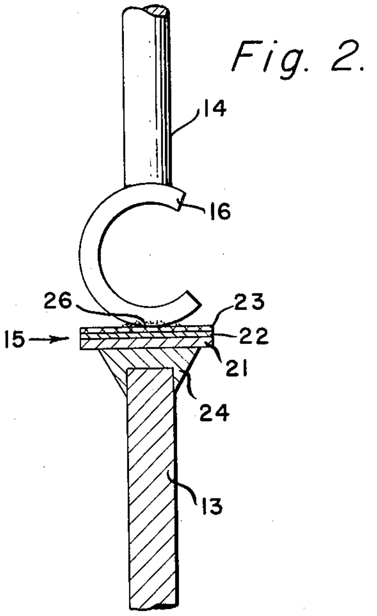
FIG. 2 is a schematic diagram partly in cross section illustrating more in detail a portion of the device as shown in FIG. 1, and FIGS. 3 and 4 are schematic diagrams partly in cross section of alternative embodiments of semiconductor devices which may be constructed in accordance with the present invention.

Referring now more particularly to FIG. 2, the internal portions of the device as illustrated in FIG. 1 are shown more in detail. Attached to lead 13 is the semiconductor body 15 which includes a crystal 21 having a region 22 of the opposite conductivity type from the crystal and attached to region 22 is an alloy region 23. The semiconductor body may be affixed to lead 13 in any manner presently known to the art. As illustrated in FIG. 2 a globule of thermosetting resin 24 which has suspended therein minute metallic particles is placed upon the surface of crystal 21 and the combination is then placed upon lead 13. Thereafter this combination is baked in order to polymerize the thermosetting resin, volatilize the fluid carrier in which resin and metallic particles are dispersed, and provide a good mechanical bond and electrical connection between the semiconductor body and lead 13. Such a process is more fully disclosed in the Barnes patent, supra. A semiconductor body as illustrated in FIG. 2 may be constructed in accordance with the method set forth in Patent No. 2,789,068 issued to J. Maserjian on April 16, 1957, and as therein defined includes a silicon crystal of N-type conductivity having a P-type conductivity region in one surface thereof and a silicon-aluminum eutectic alloy affixed to the P-type region. The P-type region is formed by evaporating a layer of molten aluminum upon the heated surface of the parent semiconductor crystal to dissolve a portion thereof and thereafter cooling the combination to form the converted P-type region. While such a semiconductor body is illustrated in FIG. 2, it is to be expressly understood that the semiconductor body may take any form presently known to the art, and may be constructed by any method presently known to the art, such as, for example, fusion, diffusion, particle bombardment and the like, in order to form junctions. Or, it may simply be a body of semiconductor material to which electrical contact is to be made.

An electrical contact element or whisker 16 is affixed to lead 14. This may be done, for example, by resistance welding techniques which are presently known to the art. Whisker 16 may be constructed from any material presently known to the art which will provide good electrical conduction between lead 14 and the semiconductor body 15. Such materials may be, for example, platinum, copper, aluminum, silver and the like. Contact element 16 is affixed to the surface of the semiconductor body by an alloy as shown at 26 in FIG. 2. This alloy contacts both element 16 and the semiconductor body and bonds the whisker to the surface of the body. Alloy 26 may be formed by any method presently known to the art, however, in the presently preferred embodiment alloy 26 is formed by applying a layer of material, including cadmium, at least upon that portion of whisker 16 which is to contact the semiconductor body. An additional layer of material which will form an alloy with the material applied to element 16 is then deposited upon the surface of the semiconductor body. Examples of materials which may be utilized are antimony, lead, nickel, silver, gold, cooper, tin, zinc, aluminum or magnesium.

In the presently preferred embodiment of the present invention, it has been found that gold works exceedingly well as the material to alloy with the cadmium containing layer of material upon element 16. The thickness of the gold which is applied to the semiconductor body is not considered to be critical so long as sufficient material is provided to obtain alloying with the material applied to element 16 and it has been found that approximately 0.2 mil in thickness is sufficient. The contact element and the semiconductor body are then brought together and heated to a temperature above the eutectic temperature of the gold and the cadmium but below the temperature at which deterioration of the semiconductor device components will begin. An alloy is thereby formed between the element 16 and the semiconductor body. The combination is then cooled to solidify the alloy and provide a bond between the two elements. A eutectic alloy will be formed, in most instances, between whisker 16 and body 15.

Alternatively, element 16 may be made of cadmium thus eliminating the application of a layer of material to the element. Furthermore, it often times becomes desirable to apply a doping material during or before an alloying process in order to assure that good ohmic contact is made between the contact element and the semiconductor body or to provide a junction within the body. If such is desirable this may be accomplished by applying the doping material to the layer of gold which is deposited upon the semiconductor body or by applying the doping material to the contact element 16. After the formation of the alloy the structure as shown in FIG. 2 is then encapsulated in its final form and is ready for utilization.

Although each of the materials listed above have been found to work well in the formation of an alloy with cadmium, tin and lead should not be used if it becomes desirable to produce a semiconductor device which has a survival temperature of the order of 300° C. Under such circumstances the remaining materials listed provide excellent bonds. In order to provide an indication of probable temperature limits of devices constructed with the various materials above set forth but without restricting the scope of the present invention, the following table is provided:

| Material Alloyed with Cadmium | Percent Cadmium in Eutectic | Eutectic Temperature, Degrees C. |
|---|---|---|
| Lead | 17.5 | 248 |
| Antimony | 92.5 | 290 |
| Nickel | 97.5 | 318 |
| Silver | 93–97 | 343–400 |
| Gold | 88 | 309 |
| Copper | 88 | 314 |
| Tin | 67.75 | 170 |
| Zinc | 82.5 | 265 |
| Aluminum 21%<br>Magnesium 53% | 26 | 420 |

Figure 3:
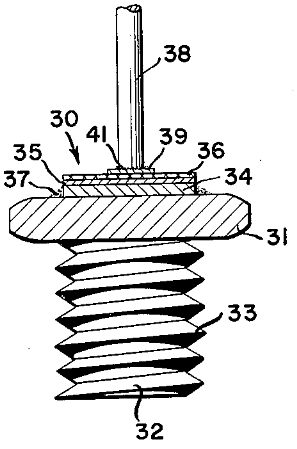

Referring now more particularly to FIG. 3, there is shown an alternative embodiment of a semiconductor device employing the present invention and as illustrated therein a mounting member 31 is provided, having a stud 32 provided with threads 33 attached thereto. Stud 32 may be utilized to attach the completed semiconductor device to a chassis or other member for further utilization, and operates also as a heat sink. Affixed to mounting member 31 is a semiconductor body 30 which includes a semiconductor crystal 34 having a region 35 of a conductivity type opposite to that of the crystal and attached to region 35 is an alloy region 36. The semiconductor body 34 is affixed to element 31 by any means well known to the art and as illustrated in FIG. 3, for example, by way of solder 37. The semiconductor body as shown in FIG. 3 may be constructed in accordance with the method described in conjunction with FIG. 2 above. A lead 38 is brought into contact with the semiconductor body and positive contact is provided between lead 38 and the semiconductor body by an alloy as illustrated at 41. This alloy will be a eutectic alloy in most instances.

The allow 41 may be provided by applying a layer of material 39 to the semiconductor body. An additional layer of material is applied to the end of lead 38. The layer of material upon lead 38 in the presently preferred embodiment includes cadmium. The layer 39 is preferably gold, but may in the alternative include any other material which will alloy with cadmium as hereinabove described. Alternatively, cadmium may be applied for layer 39 and element 38 may be comprised of any of the materials as hereinabove referred to. Lead 38 is brought into contact with the layer of material 39 and the combination heated to a temperature above the eutectic temperature of the two materials but below the temperature at which deterioration of the semiconductor body begins. An alloy is thereby provided between lead 38 and the semiconductor body. The combination is thereafter cooled to solidify the alloy and provide positive contact between the two elements. The structure as shown in FIG. 3 is then encapsulated to provide a completed semiconductor device ready for utilization.

Figure 4:
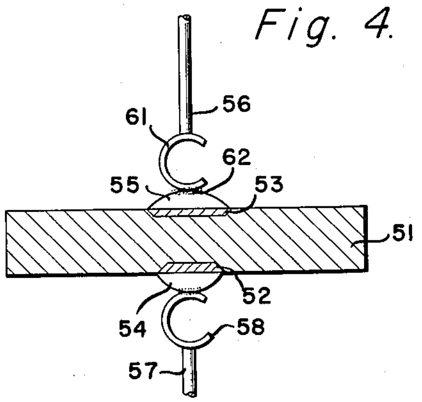

Referring now more particularly to FIG. 4, there is shown a transistor which includes a semiconductor body 51 having converted regions 52 and 53 of opposite conductivity type from that of the body. Alloy buttons 54 and 55 are in contact with converted regions 52 and 53, respectively. Leads 56 and 57 have contact elements 58 and 61 affixed as by resistance welding thereto, respectively. These contact elements are alloyed to buttons 54 and 55 to form a positive contact as hereinabove described. For example, elements 58 and 61 may have that portion in contact with buttons 54 and 55, respectively, coated with cadmium while the buttons are coated with or contain a metal which alloys with cadmium. In the alternative, elements 58 and 61 may be constructed of a metal which alloys with cadmium while buttons 54 and 55 are coated with cadmium.

There has thus been disclosed a contact element for semiconductor bodies which provides positive, temperature stable, and non-contaminating electrical contact.

What is claimed is:

1. In a semiconductor device the combination comprising: a silicon semiconductor body of one conductivity type having in at least one surface thereof a region of the opposite conductivity type, a layer of metal upon at least a portion of said opposite conductivity type region, an electrical contact element in contact with said layer, and a eutectic alloy containing cadmium between said element and said layer whereby said element is bonded to said region.

2. In a semiconductor device including a semiconductor body in a housing and having at least two elements in contact therewith, an improved connection between at least one of said elements and said body comprising: an electrode in contact with said body, at least that portion of said electrode in contact with said body including cadmium, a layer of material adapted to form a eutectic alloy with cadmium upon at least said portion of said body, and a eutectic alloy between said cadmium and said layer of material whereby said electrode is physically bonded to and electrically connected to said body.

3. A semiconductor device comprising: an envelope having first and second leads extending therein, a semiconductor body affixed to said first lead, a contact element electrically connected between the other of said leads and said semiconductor body, said contact element including cadmium, a layer of material adapted to form a eutectic alloy with cadmium upon at least a portion of said semiconductor body and a eutectic alloy between said element and said layer of material whereby said element is physically bonded to said body.

4. A semiconductor device comprising: an envelope having first and second leads protruding therein, a semiconductor body affixed to said first lead, an electrode in contact with another portion of said body, a layer of cadmium upon at least that portion of said electrode in contact with said body, a second layer of material adapted to form a eutectic alloy with cadmium upon at least that portion of said body which is contacted by said electrode, and a eutectic alloy between said layer of cadmium and said second layer whereby said electrode is physically bonded to said body.

5. In a semiconductor device the combination comprising: a silicon semiconductor body, an electrical contact element for providing electrical contact to said body, a eutectic alloy between said contact element and said body for affixing said element to said body, said eutectic alloy including cadmium.

6. In a semiconductor device the combination comprising: a silicon semiconductor body of one conductivity type and having a region of opposite conductivity type in at least one surface thereof, an electrical contact element, a gold-cadmium eutectic alloy between said element and said converted region of said body.

7. In a semiconductor device the combination comprising: a semiconductor body, an electrical contact element for providing electrical contact to said body, a layer of metal on at least a portion of a surface of said body, and a eutectic alloy including cadmium between said contact element and said layer, said eutectic alloy being formed by heating said body and said element to a temperature above the eutectic temperature of cadmium and said metal with a layer of cadmium on said element in contact with said layer of metal.

8. The combination according to claim 7 wherein said body is a silicon semiconductor crystal, said layer is a gold layer, and said eutectic is a gold cadmium eutectic.

9. The combination according to claim 7 wherein said layer comprises a material of the class consisting of antimony, lead, nickel, silver, gold, copper, tin, zinc, aluminum and magnesium.

References Cited in the file of this patent

UNITED STATES PATENTS

| | | |
|---|---|---|
| 2,193,610 | Wilson | Mar. 12, 1940 |
| 2,796,563 | Ebers et al. | June 18, 1957 |
| 2,842,831 | Pfann | July 15, 1958 |
| 2,873,216 | Schnable | Feb. 10, 1959 |
| 2,962,394 | Andres | Nov. 29, 1960 |